United States Patent [19]

Risberg

[11] Patent Number: 4,811,072

[45] Date of Patent: Mar. 7, 1989

[54] SEMICONDUCTOR DEVICE

[76] Inventor: Robert L. Risberg, 1810 S. Calhoun Rd., New Berlin, Wis. 53151

[21] Appl. No.: 863,262

[22] Filed: May 13, 1986

Related U.S. Application Data

[63] Continuation-in-part of Ser. No. 422,920, Sep. 24, 1982, Pat. No. 4,623,910.

[51] Int. Cl.⁴ .............................................. H01L 29/74
[52] U.S. Cl. ........................................ 357/38; 357/86; 357/43
[58] Field of Search ...................... 357/38, 86, 43, 23.4

[56] References Cited

U.S. PATENT DOCUMENTS

| | | | |
|---|---|---|---|
| 4,558,243 | 12/1985 | Schutten | 357/43 |
| 4,611,235 | 9/1986 | Bhagat | 357/38 |
| 4,630,092 | 12/1986 | Bhagat | 357/38 |
| 4,636,830 | 1/1987 | Bhagat | 357/38 |
| 4,646,117 | 2/1987 | Temple | 357/86 |
| 4,730,208 | 3/1988 | Sugino | 357/23.8 |

OTHER PUBLICATIONS

Electronic Design, vol. 4, Feb. 15, 1978, pp. 32-34 by Barnes.

Primary Examiner—Andrew J. James
Assistant Examiner—Mark Prenty
Attorney, Agent, or Firm—Sughrue, Mion, Zinn, Macpeak, and Seas

[57] ABSTRACT

In both lateral and vertical gate turn off devices, the P anode emitter efficiency is controlled by a monolithic N channel device. Bipolar control is effected by connecting an electrode to the region that, in the MOS control mode, would have a dielectric layer disposed between it and the MOS gate. In combination with the P anode emitter control, several structures for controlling the cathode N emitter efficiency are disclosed.

34 Claims, 5 Drawing Sheets

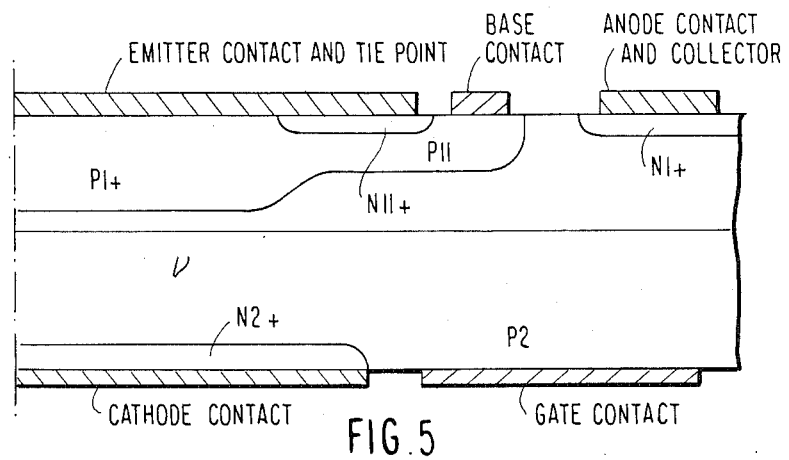
FIG.5
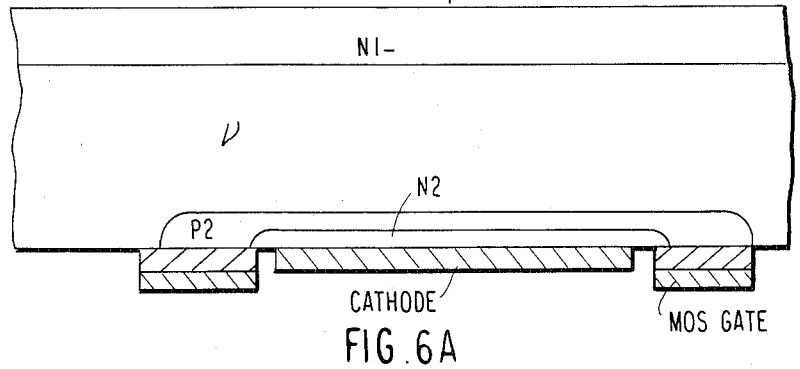
FIG.6A
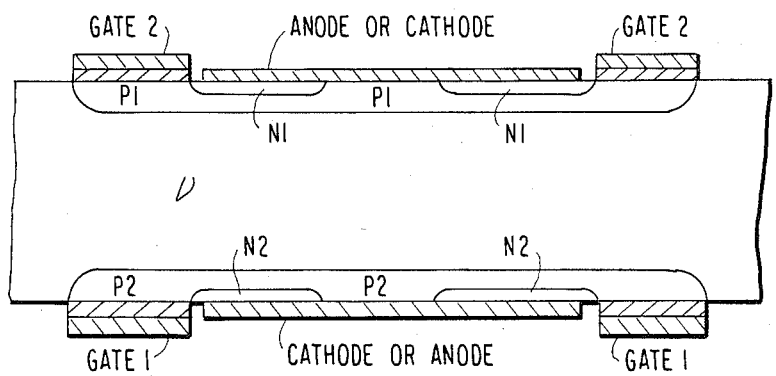
FIG.6B SYMMETRICAL BILATERAL SWITCH

SEMICONDUCTOR DEVICE

The present application is a continuation-in-part of application Ser. No. 422,920 filed 9-24-82, now U.S. Pat. No. 4,623,910, the disclosure of which is incorporated herein by reference.

BACKGROUND OF THE INVENTION

The present invention relates to multilayer semiconductor devices, and more particularly to improvements in gate turn off (GTO) thyristor structures to produce a solid state switch having improved characteristics.

2. Description of the Prior Art

The prior art in this field is described in the above-referenced copending application Ser. No. 442,920. The invention described in that application is concerned with dynamic control of conductivity modulation in power semiconductor devices, including intelligent plasma management to optimize switching efficiency. As described in that application, this requires control of both cathode N emitter efficiency and anode emitter efficiency.

SUMMARY OF THE INVENTION

It is therefore an object of the present invention to provide further improvements in GTO thyristor structures.

It is another object of the invention to provide a new semiconductor device of the GTO thyristor type having improved turn off characteristics.

It is a further object of the invention to obtain low on state anode-to-cathode conduction voltage drop, while employing n-channel Mosfet control of P anode emitter efficiency.

It is also an object of the invention to provide means for measuring the total current in a GTO device for the purpose of accurately controlling the ratio of hole and electron components of currents and for fault current detection and interruption.

It is also an object of the invention to accomplish control of lateral GTO devices as well as vertical GTO devices employing planar integrated circuit technology.

The above and other objects of the invention are accomplished by constructing a semiconductor device similar to a GTO thyristor but with means for controlling the emitter efficiency of the anode P region with a monolithic N channel Mosfet device.

In addition, three different types of cathode construction are employed to obtain GTO s with various degrees of speed, gain, and control. One type employs a conventional cathode bipolar N+ cathode and P cathode end base. Another employs a Mosfet controlled region in the cathode P base. The third employs P channel control of cathode N emitter efficiency.

P anode emitter efficiency control by monolithic npn transistors is effected by connection of a conductor to the region that otherwise, in the MOS mode, has a dielectric interposed between it and the MOS gate.

BRIEF DESCRIPTION OF THE DRAWINGS

The foregoing and other objects, aspects, and advantages of the invention will clearly appear from the following detailed description of the invention taken together with the accompanying drawings, in which:

FIG. 5 shows NPN transistor control of the P anode islands.

FIG. 6A shows a cathode side MOS controlled gate which can be used in conjunction with the anodes of FIGS. 3-5, with FIG. 6B showing a symmetrical bilateral switch configuration.

DESCRIPTION OF THE PREFERRED EMBODIMENT

Figure 3:
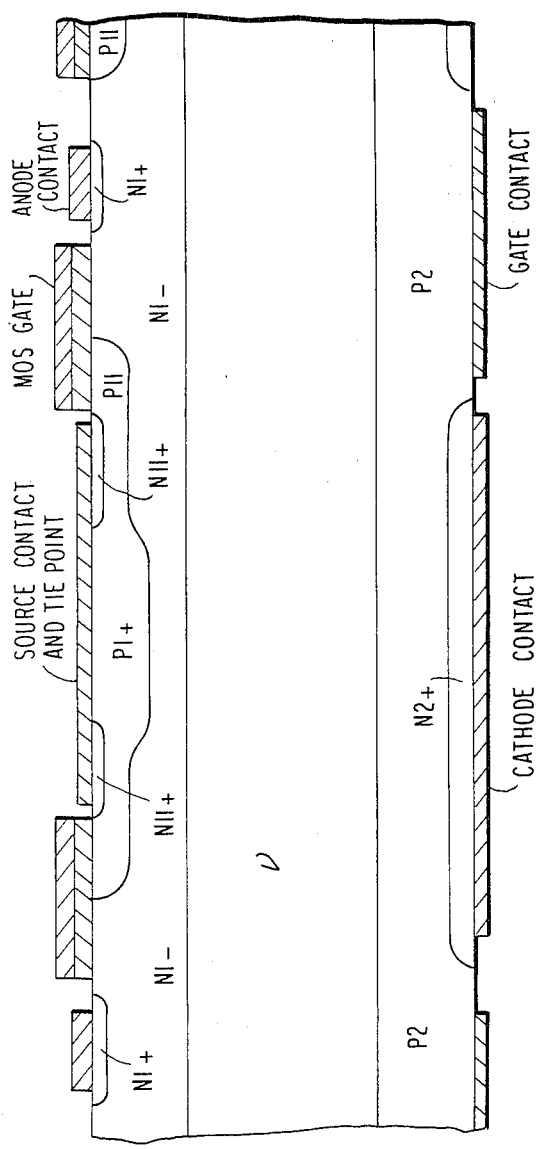
FIG. 3 shows a device employing N channel Mosfet control of hole current emitted by the P anode islands, with a metal tiepoint for the exchange of holes and electrons.

Referring now to the drawings, and more particularly to FIG. 3, the basic form of the invention comprises, in the illustrated embodiment, a body of very lightly doped N material referred to as $\nu$. The doping in this region is in the range of $10^{13}$ atoms/cm$^3$ to $10^{14}$ atoms/cm$^3$ and is usually obtained by nuclear transmutation of some of the silicon to phosphorous. The preferred crystal orientation is <111>, and it is float zone refined.

Into this material a P layer, P2, is diffused into the cathode side and a light N layer, N1−, is diffused into the anode side. Each is on the order of 30 microns deep. The surface density of N1− is typically $10^{15}$ atoms/cm$^3$ and that of P2 $10^{17}$ atoms/cm$^3$. Both diffusions are typically Gaussian profiles tapering to the value of $\nu$ below the surface. N1− can be epitaxially grown, with the advantage of obtaining doping profiles other than Gaussian, i.e., uniform doping. It is more expensive however, and not readily obtained over large surfaces and with depths of 30 microns.

Into P2 a heavy N layer. N2+, is diffused, and into N1− a heavy P layer, P1+, is diffused. These are both on the order of $2\times10^{19}$ atoms/cm$^3$ at the surface. N2+ is typically 7.5 to 10 microns deep and P1+ is 10 to 15 microns deep.

Adjacent to P1+ on the left and right, a lightly doped P layer or bowl, P11, is diffused in. The density at the surface is only a few times greater than N1−, i.e.. $4\times10^{15}$ atoms/cm$^3$. If N1− is epitaxial and uniform at a doping density such as $4\times10^{14}$ atoms/cm$^3$, the density at the surface of the P bowl can be reduced to $2\times10^{15}$ atoms/cm$^3$. Low P bowl density results in higher electron mobility when the surface is inverted during MOS operation. The P bowl is 7.5 to 10 microns deep.

Into the P bowl a heavily doped N layer. N11+, is diffused. At the same time, N1+, is diffused into N1− to create a contact for the anode.

Oxide is grown on the surface of the P bowl and on the surface of N1− between the P bowl and the anode contact at N1+. Metal or heavily doped polysilicon is deposited on this oxide. constituting the MOS gate.

N11+ and P1+ are covered with a common layer of metal, which is the source contact. The drain contact is the anode contact.

The MOS gate inverts the surface of the P bowl and accumulates the N1− part of the drain to provide high conductivity when a voltage such as +10 volts is applied relative to the source.

With the MOS gate at 0 volts or a negative voltage, anode current can only flow via N1− to the midregion $v$. With the MOS gate positive, the N1− path is shunted by the Mosfet. Mosfet source current is converted from electron current in N11+ to hole current in P1+ by providing a common metallic contact for the exchange of holes and electrons. Hole current in P1+ means holes are being emitted by P1+ into the midregion, which provides conductivity modulation of the $v$ region as normally occurs in thyristors or GTO devices.

Figure 4:
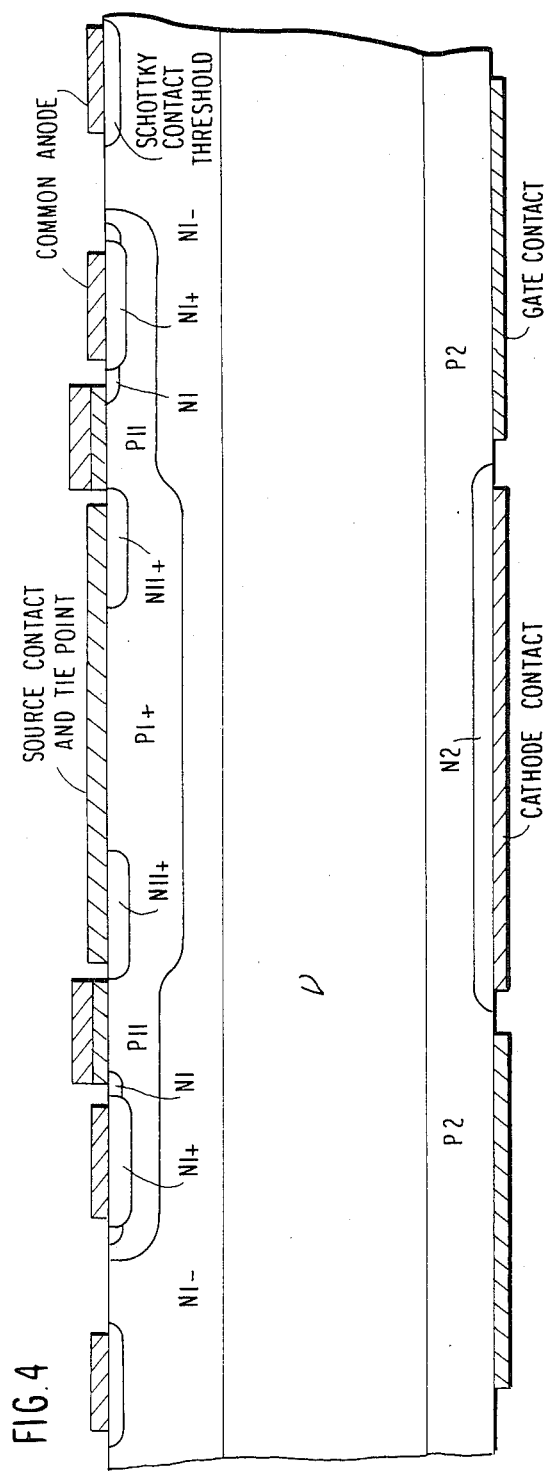
FIG. 4 shows a device similar to that of FIG. 3 but also showing two anode contact regions that are electrically common. One contact is within a P region bowl and the other is not. The latter has a Schottky diode type contact between the metal and N region to provide a forward threshold voltage to ensure conduction via the P emitter path at low currents, i.e., the paths are in shunt for anode current.

To ensure that P1+ will emit holes at low values of total anode current, two anode contacts are provided as shown in FIG. 4. These contacts are made electrically common by extending the metal over oxide between them, which is not shown in the drawing. The anode contact made to N1− is a Schottky barrier contact having a threshold voltage of approximately 0.5V. The anode contact within the P bowl is an ohmic contact to N1+. Adjacent to N1+, a light doped layer N1 is necessary to serve as a depletion region of the drain when the Mosfet is off. The Mosfet is a low voltage device, only the voltage drop created by anode current flowing in the N1− layer appears across it. This is well under 50V under the most severe dynamic conditions. However, even for low voltage it is desirable for N1 to be less than 10$^{16}$ atoms/cm$^3$. The depletion region in the off state will extend further into the P11 bowl than into the N1 drain, and P11 will support most of the blocking voltage.

With the Schottky threshold device in shunt with the Mosfet. 0.5 volts are available to cause conduction via the Mosfet and to forward bias P1+ even at low values of total anode current.

Figure 11:
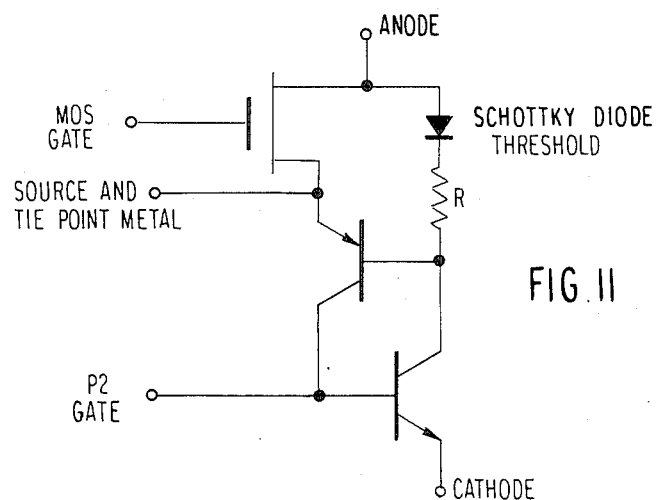
FIG. 11 is an equivalent circuit of the device of FIG. 4.

The equivalent circuit of the device of FIG. 4 is shown in FIG. 11.

The operation of the device is as follows. In the off state the anode to cathode blocking voltage can be any value up to the breakdown voltage of the device. Consequently, the depletion region can extend from the $v$P2 junction toward the anode any distance up toward the depletion stopper N1−. The turn on gate pulse is best applied by causing conduction from P2 into N2. Electrons from N2 then transit P2 into the depletion region and cause other electrons to immediately flow in any undepleted part of $v$ and in N1− toward the anode contact. Because the transit time in the depletion region is fast and conduction is by majority carriers initially in any undepleted parts of $v$ and N1−, the delay time for turn on via a P2 pulse is much shorter than if a pulse is applied from P1+ to N1+ and holes must diffuse slowly to the top edge of the depletion region.

Equally short turn on delay can be obtained by inverting the surface of P2 with the construction shown in FIG. 6A, allowing electrons to flow directly from N2 into $v$ by majority flow.

With N2P2$v$N1 turning on as a transistor an IR drop exists in N1. Turning on the anode MOS device causes P1' to emit holes which are transported rapidly through N1− by the built in field in N1− created by its doping gradient and also by the field created by electron flow in N1− and $v$. These holes cause a number of excess electrons equal to the number of holes to be retained in the $v$ region to maintain charge equality, and hence conductivity modulation begins.

In the steady state on condition, it is generally desirable to have a high density of excess holes and electrons, i.e., a plasma, in the midregion. A typical density is 10$^{17}$ excess carriers/cm$^3$ at rated current. Once the plasma has built up, conduction in the midregion is primarily by drift.

Figure 8:
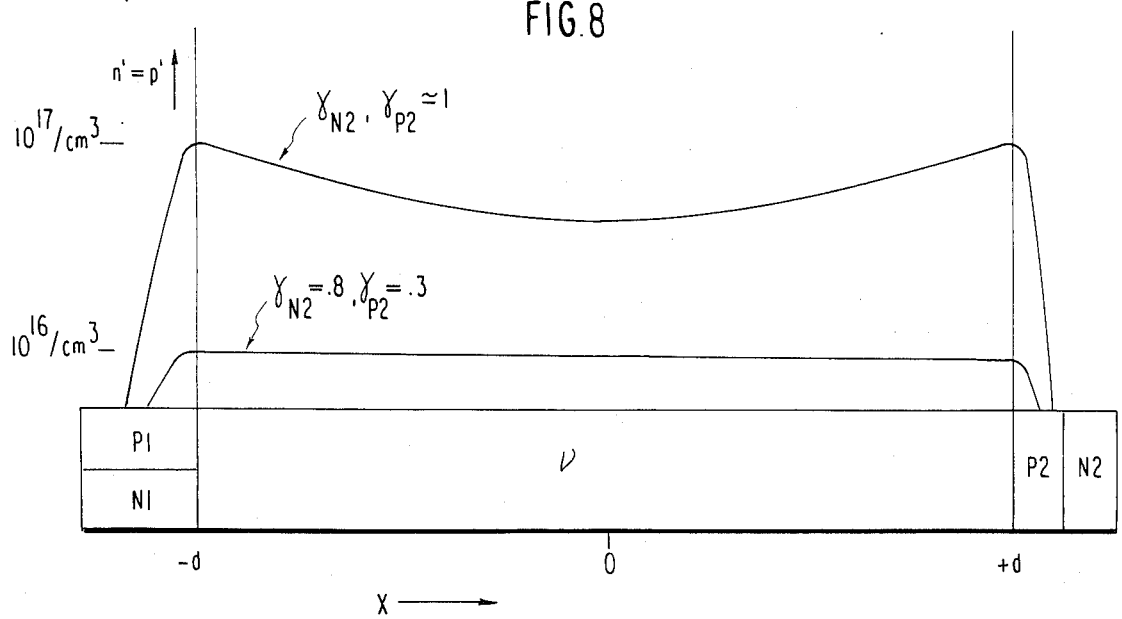
FIG. 8 is a graph showing various plasma profiles in the wide midregion of the device that are obtained by controlling the emitter efficiency of the anode P emitters and cathode N emitters.

As shown in FIG. 8, plasma density is typically lower in the center of the midregion than it is at the junction of $v$ with the end regions. The same profile exists in PIN diodes. In high voltage devices with a midregion width of 300 microns, the plasma density is quite low in the center if lifetime shortening is employed. There is a characteristic diffusion length $L = \sqrt{D\tau}$, where $\tau$ is the excess carrier lifetime and D is the diffusion coefficient.

D is typically 20 cm$^2$/sec for electrons and 8 cm$^2$/sec for holes at the plasma densities being described. The lifetime is a variable that can be controlled by processing over a range of 100 to 1, i.e., from 0.5 microseconds to 50 microseconds. Most GTO devices use gold doping or electron irradiation controlled lattice damage to shorten lifetime to about 1 microsecond. These devices have a diffusion length of 45 microns for electrons and 28 microns for holes. The result is that the plasma carrier density declines by approximately 1/e or to 37% for each space constant away from the end regions. The actual distribution is $$n' = \frac{\tau_a J_T}{2qLa}\left[\frac{\cosh(x/La)}{\sinh(d/La)} - \left(\frac{\mu_n - \mu_p}{\mu_n + \mu_p}\right)\frac{\sinh(x/La)}{\cosh(d/La)}\right] \quad (1)$$

where:
n' = excess electron density.
n' = p' = excess hole density.
n' >> $v$
d = half thickness of the $v$ region.
q = electron charge.
$\tau$a (ambipolar high injection lifetime) = $\tau$n (electron lifetime) = $\tau$p (hole lifetime)
La = ·Da$\tau$a $$Da \text{ (ambipolar diffusion coefficient)} = \frac{2D_nD_p}{D_n + D_p}$$

Dn = electron diffusion coefficient
Dp = hole diffusion coefficient device.
JT = Total anode current for a 1 cm$^2$ device.

The result of this is that the plasma density becomes quite low in the center for La less than ½ of d and dangerously low for La less than ¼ of d. Using the curve on page 114 of Semiconductor Power Devices, by S. K. Ghandi, published by John Wiley and Sons 1977, the conduction voltage drop becomes 30 times the thermal voltage $$\left(\frac{KT}{q} = .026 \text{ v}\right) \text{ for } \frac{d}{La} = 3 \text{ and } 100 \text{ times } \frac{KT}{q} \text{ or}$$

$$2.6 \text{ v for } \frac{d}{La} = 4.$$

In thyristors, d/La is typically 1 and the midregion conduction drop is only 0.05V.

The total on state conduction drop includes junction voltages at the P1ν junction and at the P2N2 junction. Together, the junction voltage drops amount to 1.0V to 1.2V.

On state drops for thyristors are typically 1.25V to 1.5V and for GTO devices 2.0V to 3.0V.

If a GTO is processed to have long lifetime, d/La will also be approximately 1. The midregion conduction drop will be similar to that of a thyristor. With the device of FIGS. 3 or 4, a junction voltage will exist at the P1+ν junction as with a thyristor. In addition, a 0.5V drop will exist through the n channel Mosfet at rated current. The total voltage drop is 1.75V to 2.0V, or under that of a typical GTO.

More importantly, the midregion plasma density can be controlled to be any value less than or equal to the maximum value obtained with the Mosfet full on. With a long excess carrier diffusion characteristic La, the plasma density will always be nearly uniform across the midregion.

With the Mosfet partially on, a larger part of the total anode current must take the path through N1— that does not involve P1+ and hence does not contribute to conductivity modulation. The effective emitter efficiency of P1+, $\gamma_{P1}$, is being controlled.

An expression for the midregion plasma that includes the effect of controlled emitter efficiencies is:

$$n'(x) = \frac{J_T \tau_a}{La}\left[(\Delta\gamma_n + \Delta\gamma_p)\frac{\cosh(x/La)}{\sinh(d/La)} + (\Delta\gamma_n - \Delta\gamma_p)\frac{\sinh(x/La)}{\cosh(d/La)}\right] \quad (2)$$

where $\Delta\gamma_n$ is defined by:

$\gamma_{n2} = \Delta\gamma_n + \gamma_n^* \quad \gamma_n^* \simeq .75 = \mu_n/(\mu_n + \mu_p)$ $\gamma_{P2} = \Delta\gamma_p + \gamma_p^* \quad \gamma_p^* \simeq .25 = \mu_p/(\mu_n + \mu_p)$ $\mu_n$ = electron mobility $\mu_p$ = hole mobility $\Delta\gamma_n$ and $\Delta\gamma_p$ can be varied provided that $\gamma_p$ or $\gamma_n$ do not exceed 1, and provided that n(x)>0 for −d<x<+d.

This equation is taken from the Ph.d. dissertation of R. L. Risberg, Dec. 1984. Marquette University. FIG. 3.6 on page 114 of that dissertation shows that plasma density can be varied over a range of greater than 10 to 1 without reducing plasma density to low enough values to encounter a high conduction drop. On pages 131–136 of the dissertation. FIGS. 3.8. 3.9 and 3.10 show forward voltage drops for the plasma distributions.

The strategy for switching the device of FIGS. 3–8 of the present application is to reduce the emitter efficiencies for an interval prior to turn off. During this interval, the plasma density is reduced from a value such as that corresponding to a midregion conduction drop of 0.05V to a level that corresponds to a drop on the order of 5V.

Ideal emitter efficiencies for obtaining low plasma density are $\gamma_n \simeq 0.75$ and $\gamma_p \simeq 0.25$. This is because electron mobility is approximately 3 times hole mobility.

The effective emitter efficiency of N2+ emitting through P2 into the ν region as though it were the N end of a PIN diode is typically 0.9. It can be reduced to 0.75 by diverting 15% of the total device current out of P2 with the device of FIGS. 3, 4, or 5. With the device of FIGS. 6A or 7A, parts of P2 contact the N2 cathode metal contact, and using the MOS gate on P2, $\gamma_{N2}$ can be varied to nearly zero if the P2 shorts around N2 are extensive.

Equation 2 assumes n′=p′>>ν. However, it is possible to extend the analysis to include n′=p′ closer to the value of ν, resulting in very low plasma density with forward voltage drops less than 50V prior to turn off.

Figure 9:
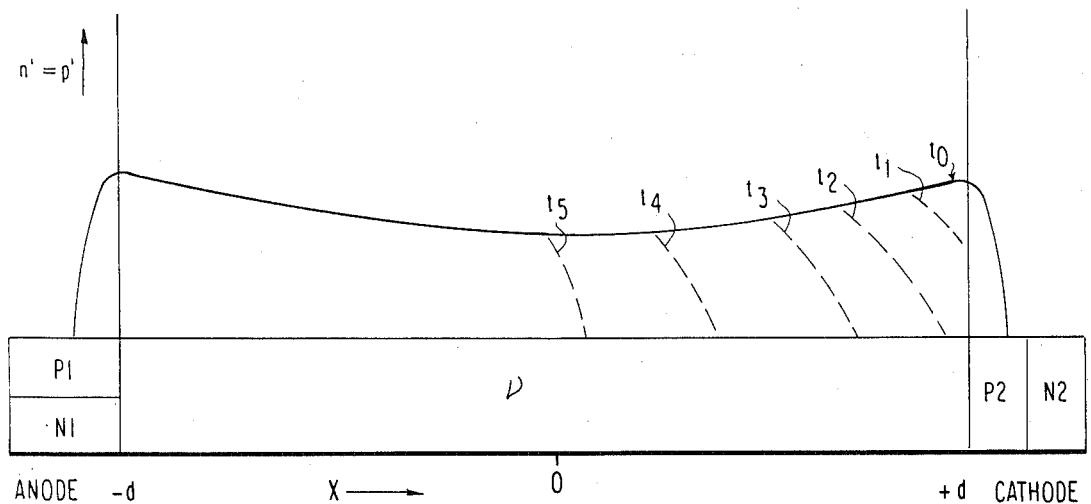
FIG. 9 shows the sweep out of midregion plasma by cathode side control only.

With the plasma reduced to some desired value just prior to switching, the reduction of $\gamma_{P1}$ to zero by switching off the anode Mosfet causes a divergence front to sweep out the plasma from the anode to cathode. FIG. 9 depicts this. To the right of the front, current components are in proportion to mobilities.

$$J_n = \text{Electron Current} = J_T\left(\frac{\mu_n}{\mu_n + \mu_p}\right)$$

$$J_p = \text{Hole Current} = J_T\left(\frac{\mu_p}{\mu_n + \mu_p}\right)$$

$J_T$ = total anode current.

where;

$\mu_n$=Electron mobility.

$\mu_p$=hole mobility.

To the left of the front all current is electron current. The front assumes a slope which increases the electron component to 100% by diffusion within the front. The front travels at a rate determined by the divergence of current components. With a nearly uniform plasma density ahead of the front, the rate is:

$$\frac{dx}{dt} = \frac{\Delta J_n}{qn'}$$

$$\Delta J_n = J_T\left[1 - \left(\frac{\mu_n}{\mu_n + \mu_p}\right)\right] \simeq .25 J_T$$

The time to sweep out the charge is approximately $$t = \frac{2dqn'}{\Delta J_n}$$

In FIG. 9, $\gamma_{N2}$ remains at a value near $$\gamma_{N2} \simeq \frac{\mu_n}{\mu_n + \mu_p} \simeq .75$$

Figure 10:
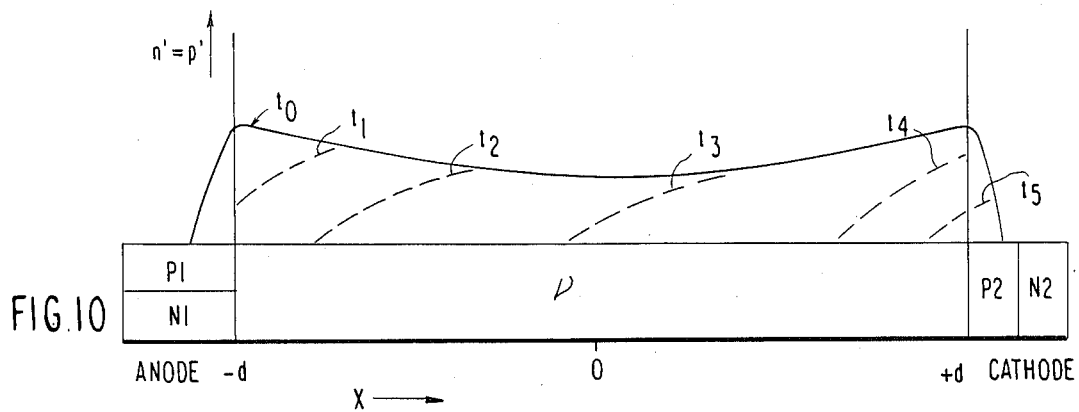
FIG. 10 shows the sweep out of midregion plasma using anode side control only.

In FIG. 10, $\gamma_{P1}$ is left on at a value near $$\gamma_{p1} \simeq \frac{\mu_p}{\mu_n + \mu_p} \simeq .25$$

and the result of reducing $\gamma_{N2}$ to zero is shown as creating a front that sweeps from right to left. The divergence component is larger $$\Delta J_p = J_T\left[1 - \left(\frac{\mu_p}{\mu_n + \mu_p}\right)\right] \simeq .75 J_T$$

and the front moves faster $$\frac{-dx}{dt} = \frac{\Delta J_p}{qn'} \quad n' = p' \text{ in plasma.}$$

In the wake of the front, the $\nu$ P2 junction depletion region is exposed. The anode to cathode voltage therefore rises rapidly during the movement of this front, unlike the situation of FIG. 10 wherein only an ohmic IR drop is developed in the wake of that front. Losses during the sweep out are higher in FIG. 11, since both high current and high voltage are present. Also, because of the junction voltage the sweep out usually stops part way across the $\nu$ region, typically half way, because the junction voltage comes into equilibrium with the external voltage. The plasma not swept out then diffuses slowly to the depletion edge, resulting in a very lossy "tailing period". This is typical of conventional GTO devices.

In addition, reducing $\gamma_{N2}$ to zero creates a dangerous situation because during the sweep out all current crossing the depletion region is hole current. The positive charge of these holes adds to the positive charge of the background stripped $\nu$ donors.

The magnitude of the mobile positive charge is $$\underset{\text{mobile}}{P} = \frac{J_T}{q \text{ Velocity limit}}$$

$$= \frac{J_T}{q \times .65 \times 10^7 \text{ cm/sec}}$$

For $J_T = 64$ amps/cm$^2$, $$\underset{\text{mobile}}{P} = 6 \times 10^{13}$$

This is roughly equal to a typical $\nu$ doping. Therefore, the E field is far more intense than with a static blocking voltage in the off state created by stripped donors alone.

The situation is exacerbated by a pinch that develops during the cutoff of N2' caused by lateral voltage in P2 debiasing all but the center of N2 before N2 is completely cutoff. The pinch creates very high local current density.

The present invention overcomes these difficulties by providing means for reducing plasma density to a desired quasi-uniform level prior to turn off, and then beginning a plasma sweep out from the anode end with only a modest rise in anode to cathode voltage in the wake of the sweep out. By also cutting off N2, the highest possible frequency of the operation is obtained, i.e., to obtain the shortest switching time, the cathode end front can also be initiated. In this case, the fronts meet in the midregion and there is no tailing period.

For most applications N2 need not be cut off. $\gamma_{N2}$ can remain at its on state value of 0.9 or 0.8 or can be somewhat reduced during turn off. In this case, all of the midregion is swept out by the anode front.

The $\nu$P2 junction is not uncovered until then. The final turn off is that of an unsaturated N2P2$\nu$N1 transistor, or if MOS control is incorporated at the cathode end, the final turn off is a majority carrier switching event. In either case the final rise of anode to cathode voltage is due to the stripping of the $\nu$ donors in the $\nu$P2 junction and does not involve hole current only flowing through the depleted $\nu$region creating critically high E fields.

During the final rise of anode to cathode voltage, P1+ can be kept active by having it conduct a small fraction of the total anode current, rather than cutting it off. The purpose of this is to keep the final fall of anode current and rise of anode to cathode voltage due to external stray inductance below predetermined limits. Also, in very lightly doped $\nu$ regions intended for high voltage applications, mobile electron negative charge can compensate the stripped $\nu$ donors positive charge and cause the depletion region to effectively move into the N1-region, which, due to its heavier doping, can create intense E fields via Poisson's equation. This is the well known Kirk effect. In such a case, the cathode and anode fronts can be initiated at the same time or with the anode front later. This allows the anode to cathode voltage to rise while the cathode front is consuming a low density residual plasma ahead of it, ensuring a mix of carrier types in the depletion region.

The anode side N channel control of P1+ and hence $\gamma_{P1}$ can also serve as a total anode current measuring device. The drain to source voltage in the on state can be used to detect fault currents and to initiate a turn off routine.

Finally, there are some applications that require a switch to conduct current in either the forward or reverse direction and to block voltage in either the forward or reverse direction, and to be capable of being turned off with low power gate control from conduction in either direction. This is a bilateral switch.

Figure 7A:
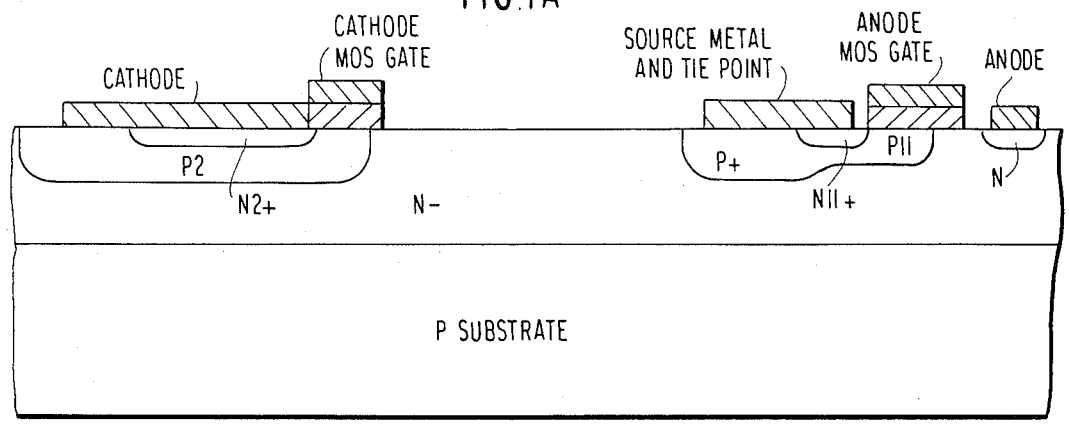
FIG. 7A shows a lateral GTO with MOS control of the cathode and anode, with FIG. 7B showing a symmetrical bilateral switch.
Figure 7B:
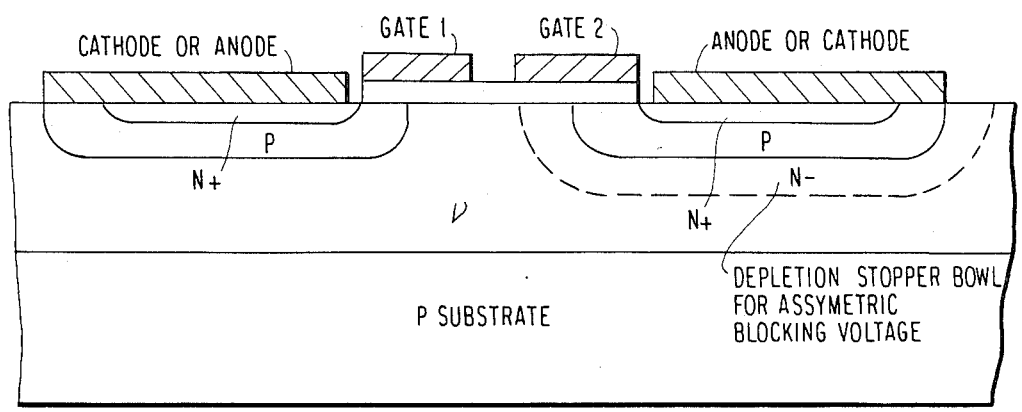

Such a device is shown in FIG. 6B in a vertical configuration, and in FIG. 7B in a lateral configuration.

The bilateral switch is more subtle than it appears. Referring to FIG. 6B, assuming the upper contact to be the positive or anode contact, the device is turned on by inverting the lower P2 surface. Anode conduction bypasses N1, and P1 acts as a P end of a PIN diode. The inversion of the surface of P2 makes the cathode end appear N like. To turn the device off, the upper surface of P1 is inverted and P2 is no longer inverted. N1 is no longer bypassed and the anode becomes relatively N like. Meanwhile, without P2 inverted, the cathode end is no longer strongly N like but becomes predominantly P like. The result is a diminution of plasma in the $\nu$ region and turn off of the device. While not as definite as the devices of FIGS. 3 and 4 in changing the anode character from P to N, the device is highly controllable compared to cathode side control with a simple P anode. In reverse conduction, the operation is initiated and terminated in a similar fashion.

It frequently occurs that a device must conduct reverse but need only block low reverse voltage. In such a case a depletion stopper bowl of light N doping can contain one end as shown in FIG. 7B. This allows minimization of the dimensions.

The overall device can also be operated in the amplifying mode by modulating $\gamma_{P1}$.

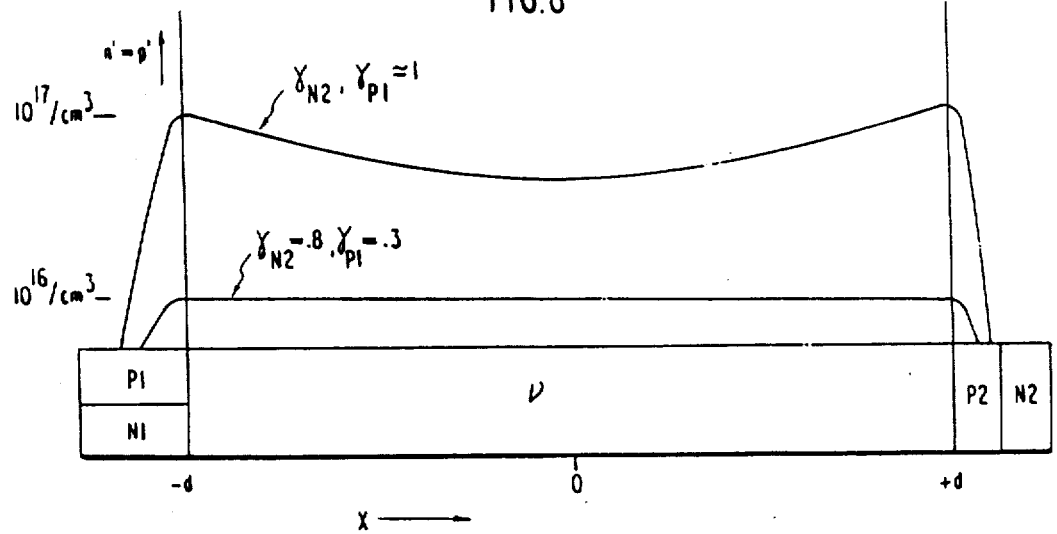

What is claimed is:

1. A semiconductor device, comprising:
   a body of semiconductor material of a first conductivity type;
   a first layer of semiconductor material of a second conductivity type on one face of said body of semiconductor material and forming a PN junction therewith;
   at least one first island region of said first conductivity type formed in said first layer;
   a cathode electrode in electrical contact with said first island region;
   a first gate electrode facing said first layer adjacent said first island region;
   at least one second island region of said second conductivity type in said semiconductor body adjacent a second face thereof opposite said one face;
   at least one third island region of said first conductivity type formed in said second island region;
   a source electrode in electrical contact with said second and third island regions;
   an anode electrode in electrical contact with said body of semiconductor material at said opposite face adjacent said second island region; and
   a second gate electrode facing said second island region at a position between said third island region and said anode electrode.

2. A semiconductor device as defined in claim 1, wherein said second gate electrode faces said semiconductor body through an insulating material.

3. A semiconductor device as defined in claim 1, wherein said second island region forms a PN junction with said semiconductor material body which is exposed at said opposite surface of said body, with said second gate electrode spanning said PN junction.

4. A semiconductor device as defined in claim 1, wherein substantially all of said second gate electrode is disposed over said second island region.

5. A semiconductor device as defined in claim 4, including an additional third island region formed in said second island region, wherein said anode electrode includes a first anode electrode portion disposed outside of said second island region and a second anode electrode portion contacting said additional third island region, and said second gate electrode disposed between said third island region and said additional third island region.

6. A semiconductor device as defined in claim 5, wherein said first anode electrode portion forms a Schottky contact with said semiconductor material body and said second anode electrode forms an ohmic contact with said additional third island region.

7. A semiconductor device as defined in claim 1, wherein said first gate electrode is in direct electrical contact with said first layer.

8. A semiconductor device as defined in claim 1, wherein said first gate electrode faces said first layer through an insulating material.

9. A semiconductor device as defined in claim 8, wherein said first layer forms a PN junction with said semiconductor material body which is exposed at said one surface, with said first gate electrode extending across said PN junction and facing all of said semiconductor body, said first layer and said first island region.

10. A semiconductor device as defined in claim 5, wherein said first gate electrode is in direct electrical contact with said first layer.

11. A semiconductor device as defined in claim 5 wherein said first gate electrode faces said first layer through an insulating material.

12. A semiconductor device as defined in claim 11, wherein said first layer forms a PN junction with said semiconductor material body which is exposed at said one surface, with said first gate electrode extending across said PN junction and facing all of said semiconductor body, said first layer and said first island region.

13. A semiconductor device, comprising:
   a body of semiconductor material of a first conductivity type:
   a first layer of semiconductor material of a second conductivity type on one face of said body of semiconductor material and forming a PN junction therewith;
   at least one first island region of said first conductivity type formed in said first layer;
   a cathode electrode in electrical contact with said first island region;
   a first gate electrode facing said first layer adjacent said first island region;
   at least one second island region of said second conductivity type in said semiconductor body adjacent a second face thereof opposite said one face;
   at least one third island region of said first conductivity type formed in said second island region;
   an emitter electrode in electrical contact with said second and third island regions;
   an anode electrode in electrical contact with said body of semiconductor material at said opposite surface adjacent said second island region; and
   a base electrode in electrical contact with said second island region.

14. A semiconductor device as defined in claim 13, wherein said first gate electrode is in direct electrical contact with said first layer.

15. A semiconductor device as defined in claim 13 wherein said first gate electrode faces said first layer through an insulating material.

16. A semiconductor device as defined in claim 15, wherein said first layer forms a PN junction with said semiconductor material body which is exposed at said one surface, with said first gate electrode extending across said PN junction and facing all of said semiconductor body, said first layer and said first island region.

17. A semiconductor device, comprising:
   a body of semiconductor material of a first conductivity type;
   a first region of semiconductor material of a second conductivity type on one face of said body of semiconductor material and forming PN junction therewith;
   at least one first island region of said first conductivity type formed in said first region adjacent a first surface thereof;
   a cathode electrode in electrical contact with said first island region;
   a first gate electrode facing said first region;
   at least one second island region of said second conductivity type in said semiconductor body adjacent said first surface;
   at least one third island region of said first conductivity type formed in said second island region;

a source electrode in electrical contact with said second and third island regions;

an anode electrode in electrical contact with said body of semiconductor material; and a second gate electrode facing said second island region at a position between said third island region and said anode electrode.

18. A semiconductor device as defined in claim 17, wherein said second gate electrode faces said semiconductor body through an insulating material.

19. A semiconductor device as defined in claim 17, wherein said second island region forms a PN junction with said semiconductor material body which is exposed at said surface of said body, with said second gate electrode spanning said PN junction.

20. A semiconductor device as defined in claim 17, wherein substantially all of said second gate electrode is disposed over said second island region.

21. A semiconductor device as defined in claim 20, including an additional third island region formed in said second island region, wherein said anode electrode includes a first anode electrode portion disposed outside of said second island region and a second anode electrode portion contacting said additional third island region, and said second gate electrode disposed between said third island region and said additional third island region.

22. A semiconductor device as defined in claim 21, wherein said first anode electrode portion forms a Schottky contact with said semiconductor material body and said second anode electrode forms an ohmic contact with said additional third island region.

23. A semiconductor device as defined in claim 17, wherein said first gate electrode is in direct electrical contact with said first region.

24. A semiconductor device as defined in claim 17, wherein said first gate electrode faces said first region through an insulating material.

25. A semiconductor device as defined in claim 24, wherein said first region forms a PN junction with said semiconductor material body which is exposed at said one surface, with said first gate electrode extending across said PN junction and facing all of said semiconductor body, said first region and said first island region.

26. A semiconductor device as defined in claim 21, wherein said first gate electrode is in direct electrical contact with said first region.

27. A semiconductor device as defined in claim 21 wherein said first gate electrode faces said first region through an insulating material.

28. A semiconductor device as defined in claim 27, wherein said first region forms a PN junction with said semiconductor material body which is exposed at said one surface, with said first gate electrode extending across said PN junction and facing all of said semiconductor body, said first region and said first island region.

29. A semiconductor device, comprising:

a body of semiconductor material of a first conductivity type;

a first region of semiconductor material of a second conductivity type on one face of said body of semiconductor material and forming a PN junction therewith;

at least one first island region of said first conductivity type formed in said first region;

a cathode electrode in electrical contact with said first island region;

a first gate electrode facing said first region adjacent said first island region;

at least one second island region of said second conductivity type in said semiconductor body adjacent said one face thereof;

at least one third island region of said first conductivity type formed in said second island region;

an emitter electrode in electrical contact with said second and third island regions;

an anode electrode in electrical contact with said body of semiconductor material adjacent said second island region; and a base electrode in electrical contact with said second island region.

30. A semiconductor device as defined in claim 29, wherein said first gate electrode is in direct electrical contact with said first region.

31. A semiconductor device as defined in claim 29 wherein said first gate electrode faces said first region through an insulating material.

32. A semiconductor device as defined in claim 31, wherein said first region forms a PN junction with said semiconductor material body which is exposed at said one surface, with said first gate electrode extending across said PN junction and facing all of said semiconductor body, said first region and said first island region.

33. A semiconductor device for selectively conducting current between first and second electrodes, said device comprising:

a body of semiconductor material of a first conductivity type;

a first region of semiconductor material of a second conductivity type on one face of said body of semiconductor material and forming a PN junction therewith;

at least one first island region of said first conductivity type formed in said first region;

a first electrode in electrical contact with said first region and said first island region;

a first gate electrode facing said first region adjacent said first island region;

at least one second region of said second conductivity type formed in said semiconductor body at a face of said semiconductor body opposite said one face;

at least one second island region of said first conductivity type formed in said second region;

a second electrode in electrical contact with said second region and second island region; and a second gate electrode facing said second region adjacent said second island region.

34. A semiconductor device as defined in claim 33, wherein said first and second gate electrodes face their respective first and second regions through insulating

* * * * *

UNITED STATES PATENT AND TRADEMARK OFFICE
CERTIFICATE OF CORRECTION

PATENT NO. : 4,811,072

DATED : March 7, 1989

INVENTOR(S) : Robert L. Risberg

Figure 1:
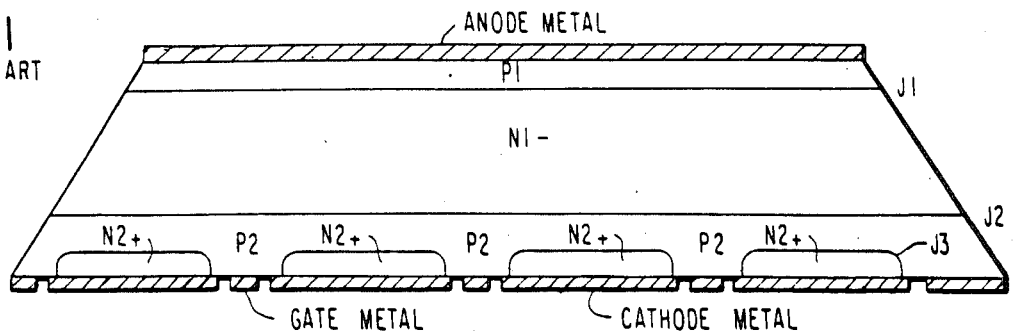
FIG. 1 is a cross-sectional view of a conventional GTO device having a plurality of anode P islands.
Figure 2:
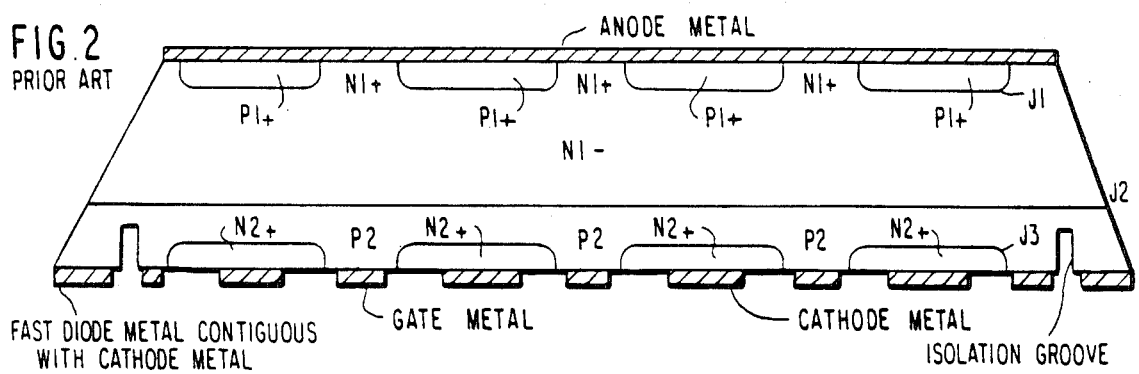
FIG. 2 is a device similar to that described in copending application 422,920 wherein control of the P emitter efficiency is obtained via PNP transistors.

It is certified that error appears in the above-identified patent and that said Letters Patent is hereby corrected as shown below:

Figure 2 of the drawing should be deleted to appear as per attached figure 2.

Figure 8 of the drawing should be deleted to appear as per attached figure 8.

On column 4, lines 52-55, Subscript notations should be used.

$\tau_a$ not $\tau a$ $\tau_n$ not $\tau n$ $\tau_p$ not $\tau p$ $L_a$ not $La$ $D_a \tau_a$ not $Da\tau a$

UNITED STATES PATENT AND TRADEMARK OFFICE
CERTIFICATE OF CORRECTION

PATENT NO. : 4,811,072

DATED : March 7, 1989

INVENTOR(S) : Robert L. Risberg

It is certified that error appears in the above-identified patent and that said Letters Patent is hereby corrected as shown below:

Column 4, lines 50-53 should then read:

$d$ = half thickness of the $\nu$ region.

$q$ = electron charge $\tau_a$ = (ambipolar high injection lifetime) = $\tau_n$ electron lifetime = $\tau_p$ (hole lifetime).

Column 6, line 26, change Fig. 9 to Fig. 10.

line 62, change Fig. 9 to Fig. 10.

line 68, change Fig. 10 to Fig. 9.

Column 7, line 24, change Fig. 11 to Fig. 9.

Signed and Sealed this

Sixth Day of March, 1990

Attest:

JEFFREY M. SAMUELS

Attesting Officer

Acting Commissioner of Patents and Trademarks

UNITED STATES PATENT AND TRADEMARK OFFICE
CERTIFICATE OF CORRECTION

PATENT NO. : 4,811,072  Page 3 of 4

DATED : March 7, 1989

INVENTOR(S) : Robert L. Risberg

It is certified that error appears in the above-identified patent and that said Letters Patent is hereby corrected as shown below:

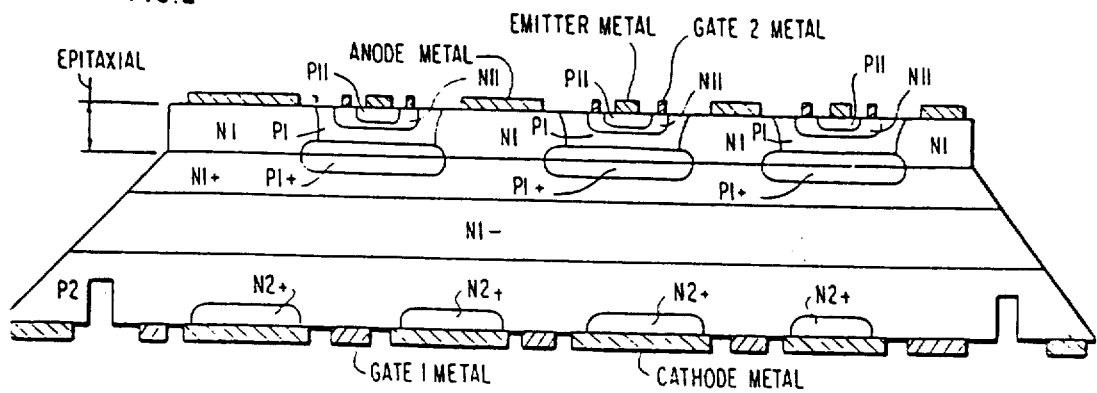

UNITED STATES PATENT AND TRADEMARK OFFICE
CERTIFICATE OF CORRECTION

PATENT NO. : 4,811,072

DATED : March 7, 1989

INVENTOR(S) : Robert L. Risberg

It is certified that error appears in the above-identified patent and that said Letters Patent is hereby corrected as shown below: